(12) United States Patent
Hattori et al.

(10) Patent No.: US 9,033,715 B2
(45) Date of Patent: May 19, 2015

(54) INTER-BOARD CONNECTION TERMINAL AND INVERTER AND ELECTRIC COMPRESSOR EMPLOYING THE SAME

(75) Inventors: Makoto Hattori, Tokyo (JP); Masahiko Asai, Tokyo (JP); Kazuki Niwa, Tokyo (JP); Hiroyuki Kamitani, Tokyo (JP); Takashi Hattori, Tokyo (JP)

(73) Assignee: MITSUBISHI HEAVY INDUSTRIES AUTOMOTIVE THERMAL SYSTEMS CO., LTD., Kiyosu-shi (JP)

( * ) Notice: Subject to any disclaimer, the term of this patent is extended or adjusted under 35 U.S.C. 154(b) by 78 days.

(21) Appl. No.: 13/823,555

(22) PCT Filed: Jan. 17, 2012

(86) PCT No.: PCT/JP2012/050805
§ 371 (c)(1),
(2), (4) Date: Mar. 14, 2013

(87) PCT Pub. No.: WO2012/099101
PCT Pub. Date: Jul. 26, 2012

(65) Prior Publication Data
US 2013/0178078 A1    Jul. 11, 2013

(30) Foreign Application Priority Data
Jan. 21, 2011    (JP) .................................. 2011-011101

(51) Int. Cl.
*H01R 12/00* (2006.01)
*H01R 13/11* (2006.01)
(Continued)

(52) U.S. Cl.
CPC ................ *H01R 13/11* (2013.01); *F04B 35/04* (2013.01); *H05K 3/368* (2013.01);
(Continued)

(58) Field of Classification Search
CPC ..... H01R 13/11; H01R 12/7052; H01R 12/52
USPC ...................................................... 439/65–66
See application file for complete search history.

(56) References Cited

U.S. PATENT DOCUMENTS 4,969,825 A    11/1990 Enomoto et al.
8,758,026 B2 *    6/2014 Mueller et al. .................. 439/65
(Continued)

FOREIGN PATENT DOCUMENTS

EP    0361971 A2    4/1990
EP    0582264 A1    2/1994
(Continued)

OTHER PUBLICATIONS

Extended European Search Report dated Jun. 24, 2014, issued in European Patent Application No. 12736691.2 (7 pages).
(Continued)

*Primary Examiner* — Khiem Nguyen
(74) *Attorney, Agent, or Firm* — Westerman, Hattori, Daniels & Adrian, LLP

(57) ABSTRACT

Provided are an inter-board connection terminal with which electrical connection between two boards can be simplified, the operability and productivity thereof can be enhanced, and reliability of electrical connection can also be ensured, as well as an inverter and an electric compressor employing the same. An inter-board connection terminal includes a group of numerous metal terminals which is inserted, individually at both tips thereof, into through-holes in boards to electrically connect two boards, wherein paired resin linking members are provided, which have a predetermined space therebetween with respect to the group of metal terminals and which join the group of metal terminals into a single unit by linking the terminals in the form of a row at both tips thereof near the bases of portions to be inserted into the through-holes in the boards.

12 Claims, 4 Drawing Sheets

(51) Int. Cl.
    *F04B 35/04*     (2006.01)
    *H05K 3/36*     (2006.01)
    *H02K 5/22*     (2006.01)
    *H01R 12/70*     (2011.01)
    *H01R 12/52*     (2011.01)
    *H05K 1/14*     (2006.01)
    *H01R 12/58*     (2011.01)
    *H01R 13/405*     (2006.01)

(52) U.S. Cl.
    CPC ............... *H05K 2201/10295* (2013.01); *H05K 2201/10424* (2013.01); *H02K 5/22* (2013.01); *H01R 12/7052* (2013.01); *H05K 1/144* (2013.01); *H05K 2201/042* (2013.01); *H01R 12/52* (2013.01); *H01R 12/58* (2013.01); *H01R 13/405* (2013.01)

(56) References Cited

U.S. PATENT DOCUMENTS

| | | |
|---|---|---|
| 2003/0092296 A1 | 5/2003 | Oldenburg et al. |
| 2010/0018243 A1 | 1/2010 | Tanaka et al. |
| 2010/0183457 A1 | 7/2010 | Hattori et al. |

FOREIGN PATENT DOCUMENTS

| | | |
|---|---|---|
| JP | 2-052268 U | 4/1990 |
| JP | 3-134981 A | 6/1991 |
| JP | 6-052944 A | 2/1994 |
| JP | 3058919 B2 | 7/2000 |
| JP | 2001-143800 A | 5/2001 |
| JP | 2007-103630 A | 4/2007 |
| JP | 2008-215235 A | 9/2008 |
| JP | 2009-156213 A | 7/2009 |
| JP | 2009-257102 A | 11/2009 |
| JP | 2010-161042 A | 7/2010 |
| WO | 98/38704 A1 | 9/1998 |

OTHER PUBLICATIONS

International Search Report for PCT/JP2012/050805, mailing date of Apr. 24, 2012.

Office Action dated Sep. 24, 2014, issued in corresponding Japanese Patent Application No. 2011-011101, with English Translation (8 pages).

Japanese Decision to Grant a Patent dated Dec. 16, 2014, issued in corresponding JP Application No. 2011-011101 (3 pages). Explanation of Relevance—"The Decision to Grant a Patent has been received."

* cited by examiner

INTER-BOARD CONNECTION TERMINAL AND INVERTER AND ELECTRIC COMPRESSOR EMPLOYING THE SAME

TECHNICAL FIELD

The present invention relates to an inter-board connection terminal employed for electrically connecting two boards (paired boards) and to an inverter and an electric compressor employing the same.

BACKGROUND ART

In a control device or the like having a plurality of boards, a harness or a connector is employed to electrically connect two boards. As disclosed in Patent Literature 1, one known example of the former employs a flexible wiring member formed of a flexible printed board in which a required number of wiring-conductor patterns that extend in parallel with each other are provided on a flexible board by means of printing or the like.

In addition, one known example of the latter is, for example, as disclosed in Patent Literature 2, a board connector in which terminal holding portions, through which numerous terminals penetrate to be individually secured thereto, form a band-like continuous structure by being linked by linking portions having smaller cross section than the terminal holding portions, which is then cut into an appropriate length at linking portions to form a seat of a predetermined length with the linked terminal holding portions, and legs that protrude toward a printed board are integrally molded in the terminal holding portions.

CITATION LIST

Patent Literature

{PTL 1} Japanese Unexamined Patent Application, Publication No. 2007-103630
{PTL 2} Japanese Unexamined Patent Application, Publication No. 2010-161042

SUMMARY OF INVENTION

Technical Problem

However, when a harness or a flexible printed board is employed, contact failure may occur due to bending springback, and when a connector is employed, contact failure or the like may occur when fitting and connecting it. In particular, in the case of an inverter employed in a vehicle-installed electric compressor or the like, there is a risk of springback becoming more prominent due to road-surface vibrations or the like; when a board is embedded in a gel material, there is a risk of the gel material invading a fitting portion of the connector, which makes contact failure more likely; and thus, there are issues with regard to electrical connection between a plurality of boards in that sufficient reliability has not been ensured, and so forth.

The present invention has been conceived in light of the above-described circumstances in order to provide an inter-board connection terminal with which electrical connection between two boards can be simplified, the operability and productivity thereof can be enhanced, and the reliability of electrical connection can also be ensured, and to provide an inverter and an electric compressor employing the same.

Solution to Problem

In order to solve the above-described problems, an inter-board connection terminal of the present invention, and an inverter and an electric compressor using the same, employ the following solutions.

An inter-board connection terminal according to a first aspect of the present invention is an inter-board connection terminal that includes a group of numerous metal terminals which is inserted, individually at both tips thereof, into through-holes in boards to electrically connect two boards, wherein paired resin linking members are provided, which have a predetermined space therebetween with respect to the group of metal terminals and which join the group of metal terminals into a single unit by linking the terminals in the form of a row at both tips thereof near the bases of portions to be inserted into the through-holes in the boards.

With this configuration, because the paired resin linking members are provided, which have a predetermined space therebetween with respect to the group of numerous metal terminals that electrically connect two boards and which join the group of metal terminals into a single unit by linking them in the form of a row at both tips thereof near the bases of portions to be inserted into the through-holes in the boards, the two boards can be electrically connected by inserting the group of numerous metal terminals, at both tips thereof, into the through-holes in the boards all at once by aligning them in a row by means of the resin linking members. Therefore, electrical connection between the two boards can be simplified and the operability and productivity thereof can be enhanced. In addition, as compared with a system employing a harness, a connector, or the like, there is no risk of contact failure due to springback or fitting, and a sufficiently reliable connection can be ensured.

In the inter-board connection terminal according to the first aspect of the present invention described above, positioning protrusions that are fitted into fitting holes provided in the two boards may be integrally provided in the paired resin linking members.

With this configuration, because the positioning protrusions that are fitted into the fitting holes provided in the two boards are integrally provided in the paired resin linking members, by fitting the positioning protrusions of the paired resin linking members into the fitting holes provided in the two boards to perform positioning and by using them as a guide, the group of numerous metal terminals can be inserted into the through-holes in the boards in a simple manner, and thus, the two boards can be connected. Therefore, it is possible to further simplify the task of connecting the two boards by means of the inter-board connection terminal. Note that it is preferable that the heights of the positioning protrusions be set slightly greater than the tip heights of the group of metal terminals in order to improve the guidability.

In the inter-board connection terminal according to the first aspect of the present invention described above, the positioning protrusions may be provided only on one end of the row of the group of metal terminals that are arranged in the form of a row along the paired resin linking members.

With this configuration, because the positioning protrusions are provided only at one end of the row of the group of metal terminals that are arranged in the form of a row along the paired resin linking members, the space on the side where the positioning protrusions are not provided can be used as a space for moving a soldering iron when soldering the group of metal terminals to the boards. Therefore, it is possible to simplify the soldering task on the group of metal terminals, and the operability and productivity thereof can be further enhanced.

In any one of the inter-board connection terminals according to the first aspect described above, of the paired resin linking members, the resin linking member disposed on the bottom side may have integrally molded legs at both ends in a direction perpendicular to the longitudinal direction thereof.

With this configuration, because, of the paired resin linking members, the resin linking member disposed on the bottom side has integrally molded legs at both ends in a direction perpendicular to the longitudinal direction thereof, in the state in which one side of the inter-board connection terminal is inserted into the through-holes in one of the boards, the inter-board connection terminal can stably be supported on the board by means of the legs that are integrally molded at both ends of the resin linking member. Therefore, connection between the other board and the inter-board connection terminal can be simplified, and the operability and productivity thereof can be further enhanced.

In any one of the inter-board connection terminals according to the first aspect described above, one of or both of the paired resin linking members may be provided with protrusions for setting a predetermined small gap with respect to a board surface when the group of metal terminals is inserted, at both tips thereof, into the through-holes in the boards.

With this configuration, because one of or both of the paired resin linking members is/are provided with the protrusions that set the predetermined small gap with respect to the board surface when the group of metal terminals is inserted, at both tips thereof, into the through-holes in the boards, it is possible to improve the flow of solder by releasing, through the small gap between the board and the resin linking member, gas generated when soldering the group of metal terminals at the tips thereof by inserting them into the through-holes in the boards. Therefore, the ease-of-soldering can be increased without having to provide thermal lands on the boards, and the reliability of the soldered connection can be enhanced.

In any one of the inter-board connection terminals according to the first aspect described above, the group of metal terminals may be individually provided with curved portions between the paired resin linking members.

With this configuration, because the curved portions are individually formed in the group of metal terminals between the paired resin linking members, it is possible to absorb vibrations that individually act on the group of metal terminals and dimensional tolerances between the two boards by means of the curved portions. Therefore, it is possible to increase vibration resistance and the ease-of-assembly of the inter-board connection terminal formed of the group of numerous metal terminals.

An inverter according to a second aspect of the present invention is an inverter which includes a paired power-system board, provided with a power-system circuit or the like for controlling a switching element, and control board, provided with a low-voltage circuit such as a CPU or the like, and in which the power-system board and the control board are arranged in two levels by being electrically connected to each other, wherein the power-system board and the control board arranged in two levels are connected by means of any one of the inter-board connection terminals described above.

With this configuration, in an inverter including a paired power-system board and control board, in which the power-system board and the control board are arranged in two levels by being electrically connected to each other, because the power-system board and the control board arranged in two levels are connected by means of any one of the above-described inter-board connection terminals, electrical connection between the paired power-system board and control board that form the inverter can be simplified, and the operability and reliability of electrical connection thereof can be increased. Therefore, it is possible to enhance the productivity of the inverter and the product reliability thereof.

An electric compressor according to a third aspect of the present invention is an electric compressor in which a housing contains a compression mechanism and an electric motor that drives the compression mechanism, and in which the electric motor is driven by an inverter that is integrally installed at the periphery of the housing, wherein the housing is provided with an inverter accommodating portion; the inverter described above is installed so as to be accommodated inside the inverter accommodating portion; and the interior thereof is filled with a gel material.

With this configuration, in the electric compressor that is driven by the inverter integrally installed in the periphery of the housing, because the housing is provided with the inverter accommodating portion, the above-described inverter is installed so as to be accommodated inside the inverter accommodating portion, and the interior thereof is filled with the gel material, the power-system board and the control board can also be connected by means of soldering using the inter-board connection terminal formed of the group of numerous metal terminals even in a system in which moisture proofing, anti-vibration properties, and insulation of the inverter are enhanced by filling the inverter accommodating portion with the gel material. Therefore, there is no risk of the gel material causing adverse effects, such as contact failure or the like, on the electrically connected portions between the boards, and thus, it is possible to enhance the quality and productivity of the electric compressor.

Advantageous Effects of Invention

With an inter-board connection terminal of the present invention, because two boards can be electrically connected by inserting a group of numerous metal terminals, at both tips thereof, into through-holes in the boards all at once by aligning them in a row by means of resin linking members, electrical connection between the two boards can be simplified, and the operability and productivity thereof can be enhanced. In addition, as compared with a system employing a harness, a connector, or the like, there is no risk of contact failure or the like due to springback or fitting, and sufficiently reliable connection can be ensured.

With an inverter of the present invention, because electrical connection between the paired power-system board and control board that form the inverter can be simplified, and the operability and reliability of the electrical connection thereof can be increased, it is possible to enhance the productivity of the inverter and the product reliability thereof.

With an electric compressor of the present invention, because a power-system board and a control board can also be connected by means of soldering using an inter-board connection terminal formed of a group of numerous metal terminals even in a system in which moisture proofing, anti-vibration properties, and insulation of an inverter are enhanced by filling an inverter accommodating portion with a gel material, there is no risk of the gel material causing adverse effects, such as contact failure or the like, on the electrically connected portions between the boards, and thus, it is possible to enhance the quality and productivity of the electric compressor.

DESCRIPTION OF EMBODIMENT

An embodiment of the present invention will be described below with reference to FIGS. 1 to 6B.

Figure 1:
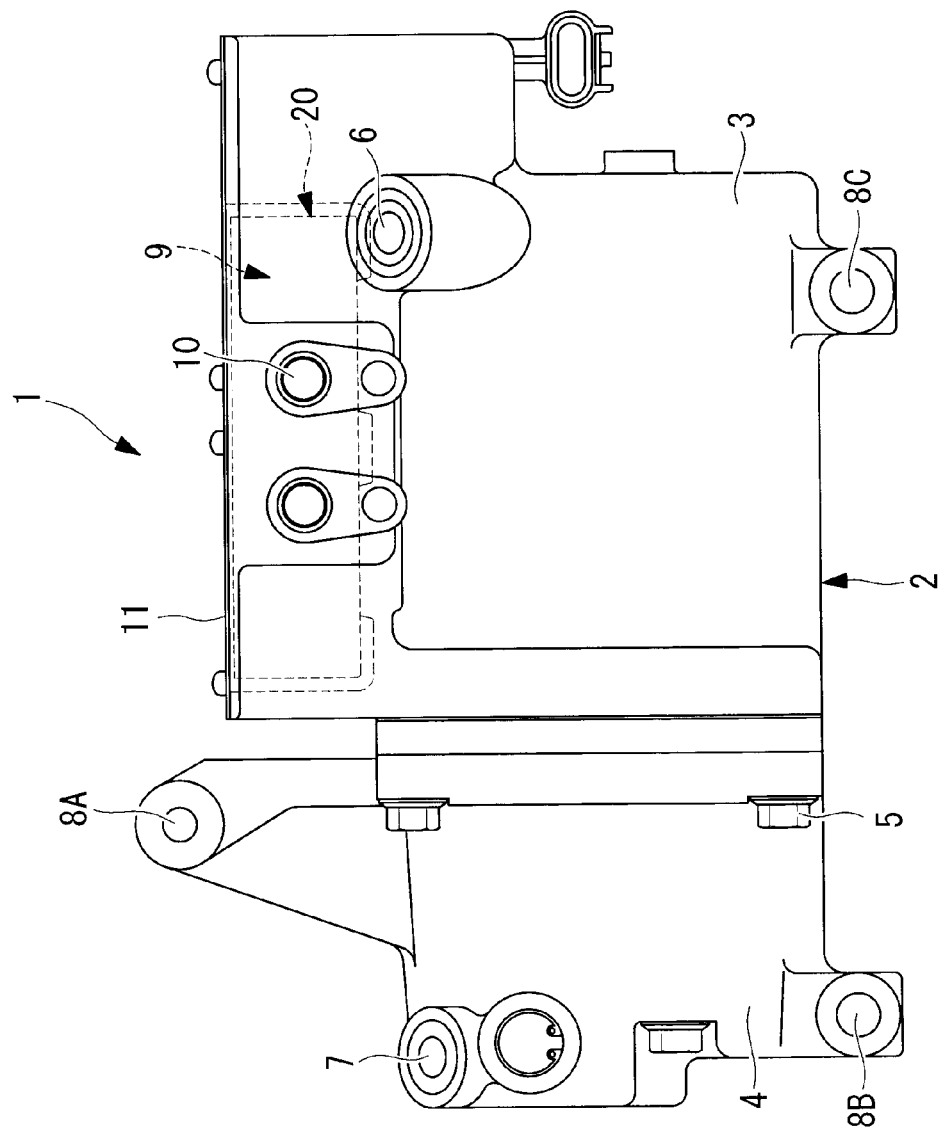
FIG. 1 is a side view of an electric compressor according to an embodiment of the present invention.

FIG. 1 is a side view of an electric compressor according to an embodiment of the present invention.

An electric compressor 1 is provided with a housing 2 that forms an outer shell thereof. The housing 2 is formed by joining a motor housing 3 that accommodates an electric motor (not shown) and a compressor housing 4 that accommodates a compression mechanism (not shown) into a single unit by fastening them together with bolts 5. The motor housing 3 and the compressor housing 4 are pressure-resistant containers made of die-cast aluminum.

The unillustrated electric motor and compression mechanism accommodated inside the housing 2 are linked via a motor shaft, and rotation of the electric motor drives the compression mechanism. A refrigerant intake port 6 is provided at one end (right side in FIG. 1) of the motor housing 3, low-temperature, low-pressure refrigerant gas that is taken into the motor housing 3 from this refrigerant intake port 6 is circulated in the surroundings of the electric motor along a motor axial line L and is subsequently taken into the compression mechanism to be compressed. High-temperature, high-pressure refrigerant gas compressed by the compression mechanism is discharged into the compressor housing 4 and is subsequently expelled to the exterior from a discharge port 7 provided at one end (left side in FIG. 1) of the compressor housing 4.

The housing 2 is provided with mounting legs 8A, 8B, and 8C at, for example, a total of three locations, namely, two locations at the bottom of the motor housing 3 at one end (right side in FIG. 1) thereof and the bottom of the compressor housing 4 at one end (left side in FIG. 1) thereof, and one location at the top of the compressor housing 4. The integrated-inverter electric compressor 1 is installed in a vehicle by securing these mounting legs 8A, 8B, and 8C by means of brackets and bolts, on a side wall or the like of a driving engine installed in an engine compartment of the vehicle.

An inverter accommodating portion 9 having a predetermined volume is integrally molded at a peripheral portion of the motor housing 3 at the top thereof. This inverter accommodating portion 9 has a box shape that is surrounded by surrounding walls having a predetermined height so that the top face thereof is open, and two power-cable outlets 10 are provided on a side face thereof. In addition, a cover member 11 is secured to the top face of the inverter accommodating portion 9 with screws so as to close it up.

An inverter 20 that converts DC power supplied from a vehicle-installed power unit (not shown) or a battery via a power cable into three-phase AC power and applies it to the electric motor accommodated inside the motor housing 3 is installed in the inverter accommodating portion 9 so as to be accommodated in the interior thereof. The inverter 20 is formed of, in addition to two boards, namely, a power-system board (board) 21 and a control board (board) 22, to be described below, other electric parts, such as semiconductor-switching elements, such as six IGBTs (Insulated Gate Bipolar Transistors) or the like that form top-arm switching elements and bottom-arm switching elements of individual phases in a three-phase inverter (not shown), a smoothing capacitor (head capacitor), an inductor coil, and so forth.

Figure 2:
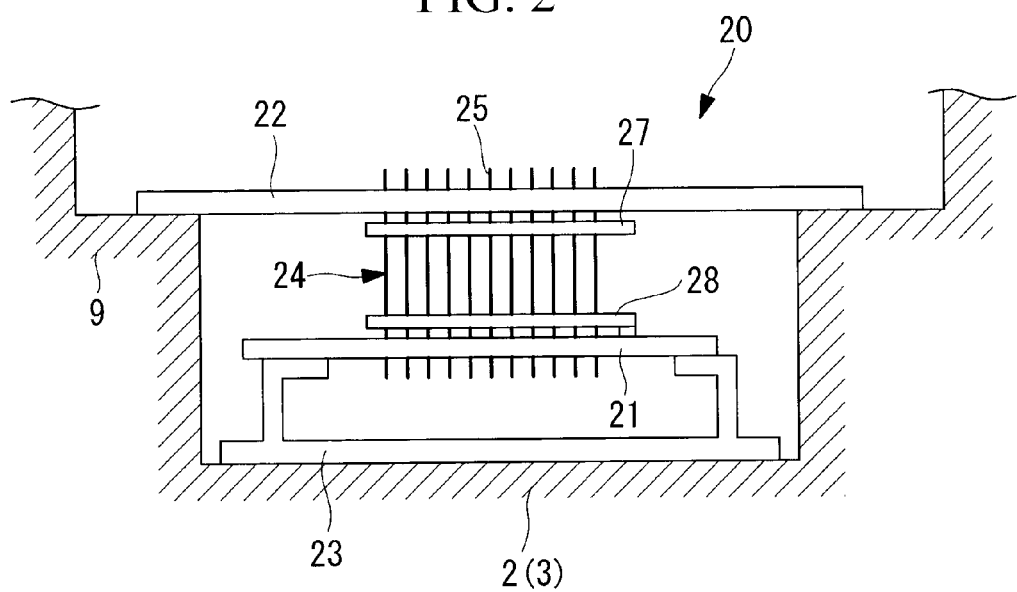
FIG. 2 is a sectional view showing, in outline, an inverter accommodating portion of the electric compressor shown in FIG. 1.
Figure 3:
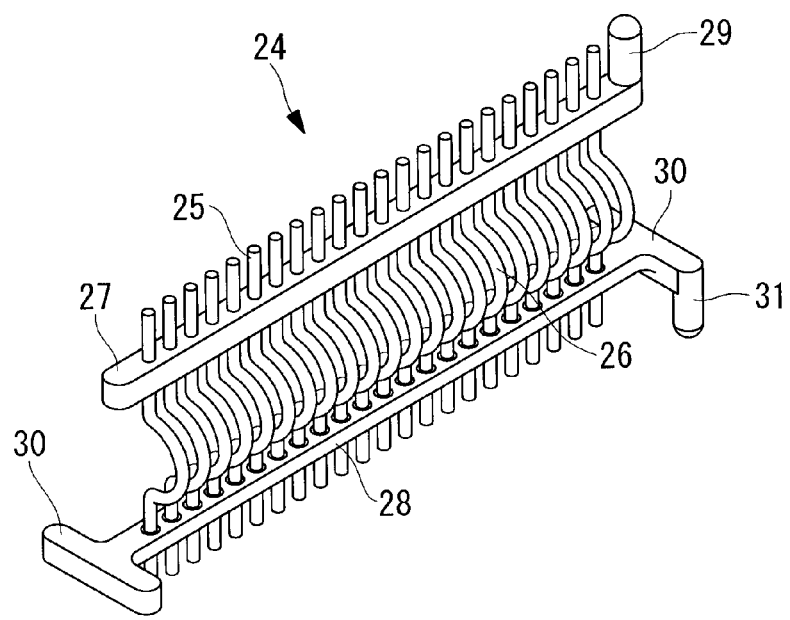
FIG. 3 is a perspective view of an inter-board connection terminal employed for connecting two boards in an inverter shown in FIG. 2.

FIG. 2 is a longitudinal sectional view of the inverter accommodating portion 9, and FIGS. 3 to 6B are configuration diagrams of the inter-board connection terminal therein.

At the bottom surface of the inverter accommodating portion 9, that is, at a peripheral surface of the motor housing 3, a board-mounting base 23 made of an aluminum-alloy plate, which also serves as a heat sink, is secured by being fastened with screws or the like, and semiconductor-switching elements such as IGBTs or the like are installed on the board-mounting base 23. The power-system board 21, which is provided with a power-system control circuit or the like for a high-voltage system that operates the semiconductor-switching elements to convert the DC power into the three-phase AC power and applies it to the electric motor, is installed on the board-mounting base 23 above the semiconductor-switching elements, being secured thereto with screws or the like.

In addition, the control board (CPU board) 22, which is provided with a control communication circuit such as a CPU or the like that is operated with low voltage, and which controls the three-phase AC power to be applied to the electric motor via the power-system board 21, is installed above the power-system board 21. This embodiment is an example in which the control board 22 is secured to a boss portion of the inverter accommodating portion 9 by being fastened with screws or the like. The power-system board 21 and the control board 22 that are arranged in two levels are electrically connected via an inter-board connection terminal 24.

As shown in FIGS. 3 to 6B, the inter-board connection terminal 24 is provided with a group of numerous metal terminals 25 that are aligned in one row. The group of metal terminals 25 are formed of brass, phosphorous bronze, or the like and are individually inserted, at both tips thereof, into through-holes in the power-system board 21 and the control board 22 and are soldered thereto, thus electrically connecting the two boards, namely, the power-system board 21 and the control board 22. Curved portions 26 are individually formed at an intermediate portion in the group of metal terminals 25 to absorb vibrations, dimensional tolerances, and so forth.

In addition, paired resin linking members 27 and 28 that join the group of numerous metal terminals 25 into a single unit in the form of a row are provided at both tip portions of the group of metal terminals 25 near the bases of portions to be inserted into the through-holes in the power-system board 21 and the control board 22. The paired resin linking members 27 and 28 are long, thin rod-like square bars, in which numerous holes through which the group of numerous metal terminals 25 penetrate at both tips thereof are provided in one row at a predetermined pitch, and are provided with a predetermined space therebetween on both sides of the group of metal terminals 25 so as to flank the curved portions 26.

Of the paired the paired resin linking members 27 and 28, the resin linking member 27 disposed at the top side has, at one end thereof, an integrally molded positioning protrusion 29 that is fitted into a fitting hole (not shown) provided in one of the two boards, for example, the control board 22. In addition, the resin linking member 28 disposed on the bottom side has integrally molded legs 30 at both ends in the direction perpendicular to the longitudinal direction thereof, and, of the legs 30, the leg 30 on one end has an integrally molded positioning protrusion 31 that is fitted into a fitting hole (not shown) provided in the other of the two boards, for example, the power-system board 21. Note that the heights of the positioning protrusions 29 and 31 are set to be greater than the protruding heights of the group of metal terminals 25 that protrude from the paired resin linking members 27 and 28.

Figure 6A:
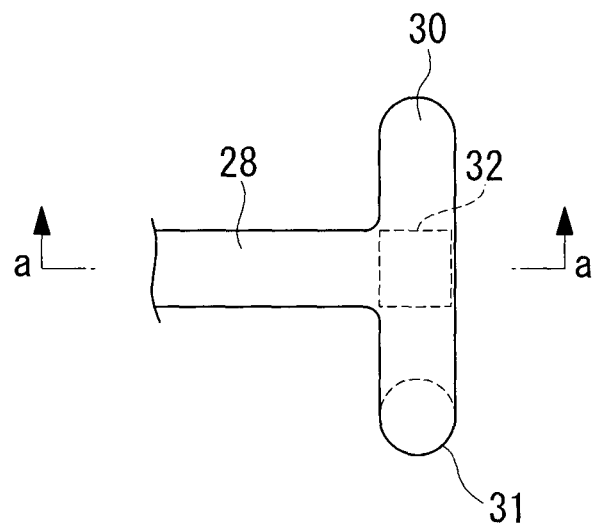
FIG. 6A is a plan view showing one end of a bottom-side resin linking member that forms the inter-board connection terminal shown in FIG. 3.
Figure 6B:
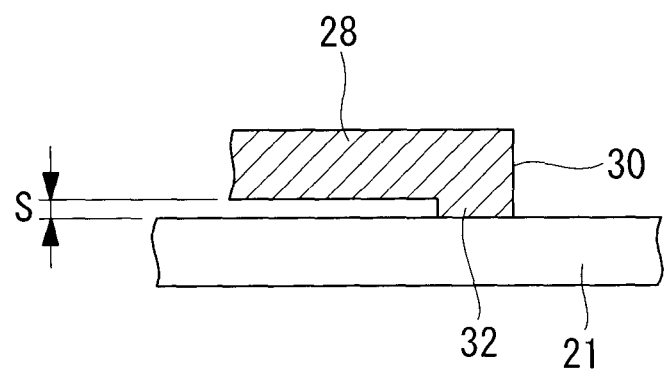
FIG. 6B is a sectional view taken along a-a in a state in which the end shown in FIG. 6A is in contact with a board.

In addition, as shown in FIGS. 6A and 6B, one of or both of the paired resin linking members 27 and 28 is/are provided with protrusions 32 in order to set a predetermined small gap S, for example, a gap S of about 0.5 mm, with respect to the board surface when the group of metal terminals 25 are inserted, at both tips thereof, into the through-holes in the power-system board 21 and the control board 22. Note that, although this embodiment is an example in which the protrusions 32 are provided on the resin linking member 28, the same protrusions may also be provided on the resin linking member 27 so that the same small gap S is also formed between surfaces of the resin linking member 27 and the control board 22; alternatively, the control board 22 may be installed in the boss portion.

Furthermore, after installing the inverter 20 so as to be accommodated inside the inverter accommodating portion 9, the interior thereof is filled with a resin gel material, such as silicone gel, up to a level where the power-system board 21 and the control board 22 are embedded therein and is closed up by means of the cover member 11. By doing so, it is possible to ensure moisture proofing, anti-vibration properties, and insulation of the inverter 20.

With the above-described configuration, this embodiment affords the following operational advantages.

DC power supplied to the inverter 20, which is installed inside the inverter accommodating portion 9, from the power unit via the power cable is converted into three-phase AC power having a command frequency through the operation of the switching circuit formed of the plurality of semiconductor-switching elements or the like in the inverter 20 and is applied to the electric motor in the motor housing 3. The conversion to the three-phase AC power having the command frequency is performed by controlling the power-system control circuit on the power-system board 21 via the control board 22 based on control command values input to the control board 22 from a higher-level control device.

By doing so, the electric motor is rotationally driven at a control-command frequency, thus operating the compression mechanism. By operating the compression mechanism, the low-temperature, low-pressure refrigerant gas is taken into the motor housing 3 from the refrigerant intake port 6. This refrigerant flows in the surroundings of the electric motor in the motor axial direction toward the compressor housing 4 to be taken into the compression mechanism; the refrigerant that has been compressed into the high-temperature, high-pressure state by means of the compression mechanism is discharged into the compressor housing 4, and is subsequently expelled to the exterior of the electric compressor 1 via the discharge port 7.

Figure 4:
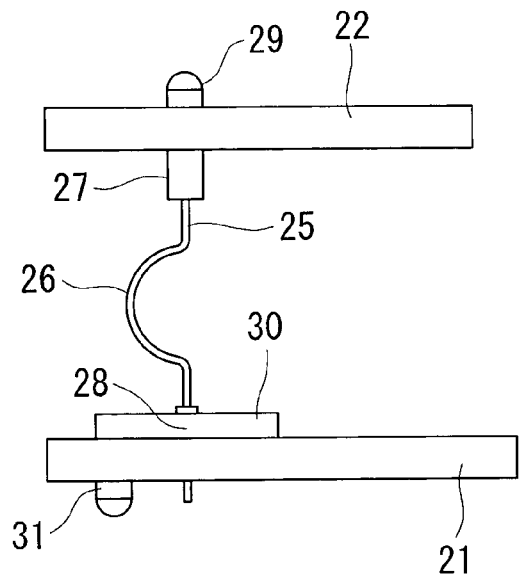
FIG. 4 is a side view, in a longitudinal direction, showing a state in which the two boards are connected by employing the inter-board connection terminal shown in FIG. 3.
Figure 5:
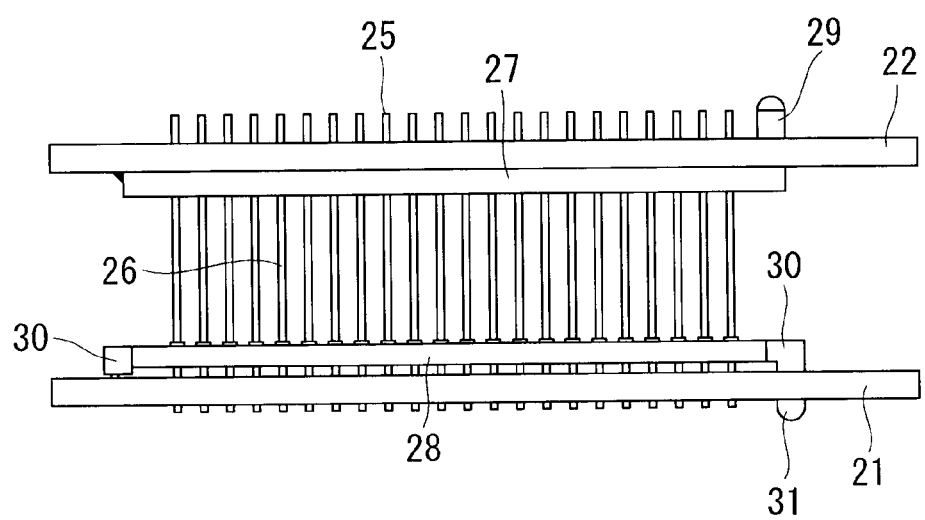
FIG. 5 is a right side view of FIG. 4.

The power-system board 21 and the control board 22 that form the inverter 20 are electrically connected via the inter-board connection terminal 24. With the inter-board connection terminal 24, the positioning protrusion 31 of the resin linking member 28 is fitted into the fitting hole in the power-system board 21 first, and, by using this as a guide, the group of numerous metal terminals 25 are inserted, at the tips thereof, into the through-holes in the power-system board 21. As shown in FIG. 4, when they are inserted to a position where the protrusions 32 provided in the resin linking member 28 come in contact with the surface of the power-system board 21, the group of metal terminals 25 penetrate the through-holes in the power-system board 21 so that the tips thereof protrude on the other side of the board, and the small gap S is also set between the surfaces of the resin linking member 28 and the power-system board 21.

The group of metal terminals 25 can be connected to the power-system board 21 by soldering the group of metal terminals 25 in the through-holes at the tips thereof while moving a soldering iron from the end of the resin linking member 28 where the positioning protrusion 31 is provided to the other end thereof. Gas generated during soldering is released via the small gap S. The power-system board 21 to which the inter-board connection terminal 24 has been connected in this way can be installed by being secured to the board mounting base 23 inside the inverter accommodating portion 9, and the inter-board connection terminal 24 is stably supported on the power-system board 21 by means of the legs 30 provided at both ends of the resin linking member 28.

Next, the control board 22 is installed from above the inter-board connection terminal 24 supported on the power-system board 21. To install the control board 22, the positioning protrusion 29 provided at one end of the resin linking member 27 is fitted into the fitting hole provided in the control board 22, and, by using this as a guide, the group of numerous metal terminals 25 is inserted into the through-holes in the control board 22. By doing so, the control board 22 is installed in substantially the same manner as the power-system board 21 with respect to the inter-board connection terminal 24, and the group of metal terminals 25 can be connected to the control board 22 by soldering the group of metal terminals 25 in the through-holes at the tips thereof while moving the soldering iron from the end of the resin linking member 27 where the positioning protrusion 29 is provided to the other end thereof.

After installing the inverter 20 in this way so as to be accommodated inside the inverter accommodating portion 9, moisture proofing, anti-vibration properties, and insulation of the inverter 20 are achieved by filling the interior of the inverter accommodating portion 9 with the resin gel material, such as silicone gel, and, by attaching the cover member 11 in this state, thus closing up the inverter accommodating portion 9, the inverter 20 is integrally installed in the housing 2.

In this way, with this embodiment, the two boards 21 and 22 can be electrically connected by inserting the group of numerous metal terminals 25, at both tips thereof, into the through-holes in the power-system board 21 and the control board 22 all at once by aligning them in a row by means of the resin linking members 27 and 28, and by soldering the individual tips to the power-system board 21 and the control board 22. Therefore, the electrical connection between the two boards, namely, the power-system board 21 and the control board 22, can be simplified, and the operability and productivity thereof can be enhanced. In addition, as compared with a system employing a harness, a connector, or the like, there is no risk of contact failure due to springback or fitting, and a sufficiently reliable connection can be ensured.

In addition, by fitting the positioning protrusions 29 and 31 provided in the paired resin linking members 27 and 28 into the fitting holes of the power-system board 21 and the control board 22 to perform positioning and by using them as a guide, the group of numerous metal terminals 25 can be inserted into the through-holes in the power-system board 21 and the control board 22 in a simple manner, and thus, the two boards 21 and 22 can be connected. Therefore, it is possible to further simplify the task of connecting the two boards, namely, the power-system board 21 and the control board 22, by means of the inter-board connection terminal 24. Note that, because the heights of the two positioning protrusions 29 and 31 are set slightly greater than the tip heights of the group of metal terminals 25, it is possible to increase the guidability when inserting the group of metal terminals 25 into the through-holes.

Furthermore, because the positioning protrusions 29 and 31 are provided only at one end of the row of the group of metal terminals 25 that are arranged in the form of a row along the paired resin linking members 27 and 28, the space on the side where the positioning protrusions 29 and 31 are not provided can be used as a space for moving the soldering iron when soldering the group of metal terminals 25 to the power-system board 21 as well as the control board 22, and therefore, it is possible to simplify the soldering task on the group of metal terminals 25, and the operability and productivity thereof can be further enhanced.

In addition, the resin linking member 28 disposed on the bottom side has the integrally molded legs 30 at both ends in the direction perpendicular to the longitudinal direction thereof. Because of this, in the state in which one side of the inter-board connection terminal 24 is inserted into the through-holes in one of the boards, that is, the power-system board 21, the inter-board connection terminal 24 can stably be supported on the power-system board 21 by means of the legs 30 that are integrally molded at both ends of the resin linking member 28. By doing so, connection between the other board, that is, the control board 22, and the inter-board connection terminal 24 can be simplified, and the operability and productivity thereof can be further enhanced.

In addition, one of or both of the paired resin linking members 27 and 28 is/are provided with the protrusions 32 that set the small gap S with respect to the board surface when the group of metal terminals 25 is inserted, at both tips thereof, into the through-holes in the power-system board 21 and the control board 22. Because of this, it is possible to improve the flow of solder by releasing, through the small gaps S between the individual boards 21 and 22 and the resin linking members 27 and 28, the gas generated when soldering the group of metal terminals 25 at the tips thereof by inserting them into the through-holes in the individual boards 21 and 22. Therefore, the ease-of-soldering can be increased without having to provide thermal lands on the individual boards 21 and 22, and the reliability of the soldered connection can be enhanced.

In addition, with this embodiment, the curved portions 26 are individually formed in the group of metal terminals 25 in the inter-board connection terminal 24 in the portions thereof between the paired resin linking members 27 and 28. Because of this, it is possible to absorb vibrations that individually act on the group of metal terminals 25 and dimensional tolerances between the power-system board 21 and the control board 22 by means of the curved portions 26. Accordingly, it is possible to increase vibration resistance and the ease-of-assembly of the inter-board connection terminal 24 formed of the group of numerous metal terminals 25.

Furthermore, with this embodiment, because the power-system board 21 and the control board 22 that form the inverter 20 and that are arranged in two levels are connected by means of the inter-board connection terminal 24 having the above-described configuration, electrical connection between the paired power-system board 21 and control board 22 that form the inverter 20 can be simplified, and the operability and reliability of the electrical connection thereof can be increased. Therefore, it is possible to enhance the productivity of the inverter 20 and the product reliability thereof.

Similarly, because the configuration of the electric compressor 1 that is driven by means of the inverter 20 integrally installed at the periphery of the housing 2 is such that the inverter accommodating portion 9 is provided in the housing 2, the above-described inverter 20 is installed so as to be accommodated in the inverter accommodating portion 9, and the interior thereof is filled with the gel material, the power-system board 21 and the control board 22 can also be connected by means of soldering using the inter-board connection terminal 24 formed of the group of numerous metal terminals 25 even in the electric compressor 1 in which moisture proofing, anti-vibration properties, and insulation of the inverter 20 are enhanced by filling the inverter accommodating portion 9 with the gel material. Therefore, there is no risk of the gel material causing adverse effects, such as contact failure or the like, on the electrically connected portions between the boards 21 and 22, and thus, it is possible to enhance the quality and productivity of the electric compressor 1.

Note that the present invention is not limited to the invention according to the above-described embodiment, and appropriate modifications are permissible within a range that does not depart from the spirit thereof. For example, although an example in which the power-system board 21 and the control board 22 are installed so as to be separately accommodated inside the inverter accommodating portion 9 has been described in the above-described embodiment, it is naturally permissible to install them as a single unit by forming a module. In addition, the board mounting base 23 and the power-system board 21 may be integrated by installing the semiconductor-switching elements, such as IGBTs or the like, on the power-system board 21.

Furthermore, the inter-board connection terminal 24 according to the present invention is not limited to the connection between the two boards, namely, the power-system board 21 and the control board 22, that form the inverter 20, and it is naturally possible to widely employ the present invention for electrically connecting boards employed in various control devices. In addition, the group of numerous metal terminals 25 and the paired resin linking members 27 and 28 can be integrally molded by a known method such as insert molding or the like. Also, the electrical connection between the individual boards 21 and 22 and the inter-board connection terminal 24 may be achieved by a solderless connection method in which the individual terminals are connected by being press-fitted into the through-holes in the boards 21 and 22.

REFERENCE SIGNS LIST

1 Electric Compressor
2 Housing
9 Inverter accommodating portion
20 Inverter
21 Power-system Board (board)
22 Control Board (board)
24 Inter-board Connection Terminal 25 Group of Metal Terminals
26 Curved Portion
27, 28 Resin Linking Member
29, 31 Positioning Protrusion
30 Leg
32 Protrusion
S Small Gap

The invention claimed is:

1. An inter-board connection terminal that includes a group of numerous metal terminals which is inserted, individually at both tips thereof, into through-holes in boards to electrically connect two boards, said inter-board connection terminal comprising:
    paired resin linking members, which have a predetermined space therebetween with respect to the group of metal terminals and which join the group of metal terminals into a single unit by linking the group of metal terminals in the form of a row at both tips thereof near the bases of portions to be inserted into the through-holes in the boards; and
    positioning protrusions fitted into fitting holes provided in the two boards are integrally provided in the paired resin linking members, wherein
    the positioning protrusions are provided only on one end of the row of the group of metal terminals that are arranged in the form of a row along the paired resin linking members.

2. The inter-board connection terminal according to claim 1, wherein, of the paired resin linking members, the resin linking member disposed on the bottom side has integrally molded legs at both ends in a direction perpendicular to the longitudinal direction thereof.

3. The inter-board connection terminal according to claim 1, wherein one of or both of the paired resin linking members is/are provided with protrusions for setting a predetermined small gap with respect to a board surface when the group of metal terminals is inserted, at both tips thereof, into the through-holes in the boards.

4. The inter-board connection terminal according to claim 1, wherein the group of metal terminals is individually provided with curved portions between the paired resin linking members.

5. An inverter which includes a paired power-system board, provided with a power-system circuit or the like for controlling a switching element, and control board, provided with a low-voltage circuit such as a CPU or the like, and in which the power-system board and the control board are arranged in two levels by being electrically connected to each other, wherein the power-system board and the control board arranged in two levels are connected by means of the inter-board connection terminal according to claim 1.

6. An electric compressor in which a housing contains a compression mechanism and an electric motor that drives the compression mechanism, and in which the electric motor is driven by an inverter that is integrally installed at the periphery of the housing, wherein the housing is provided with an inverter accommodating portion; the inverter according claim 5 is installed so as to be accommodated inside the inverter accommodating portion; and the interior thereof is filled with a gel material.

7. The inter-board connection terminal according to claim 2, wherein one of or both of the paired resin linking members is/are provided with protrusions for setting a predetermined small gap with respect to a board surface when the group of metal terminals is inserted, at both tips thereof, into the through-holes in the boards.

8. The inter-board connection terminal according to claim 2, wherein the group of metal terminals is individually provided with curved portions between the paired resin linking members.

9. An inverter which includes a paired power-system board, provided with a power-system circuit or the like for controlling a switching element, and control board, provided with a low-voltage circuit such as a CPU or the like, and in which the power-system board and the control board are arranged in two levels by being electrically connected to each other, wherein the power-system board and the control board arranged in two levels are connected by means of the inter-board connection terminal according to claim 2.

10. The inter-board connection terminal according to claim 3, wherein the group of metal terminals is individually provided with curved portions between the paired resin linking members.

11. An inverter which includes a paired power-system board, provided with a power-system circuit or the like for controlling a switching element, and control board, provided with a low-voltage circuit such as a CPU or the like, and in which the power-system board and the control board are arranged in two levels by being electrically connected to each other, wherein the power-system board and the control board arranged in two levels are connected by means of the inter-board connection terminal according to claim 4.

12. An inter-board connection terminal that includes a group of numerous metal terminals which is inserted, individually at both tips thereof, into through-holes in each of two boards and is soldered thereto to electrically connect the two boards, wherein
    paired resin linking members are provided, which have a predetermined space therebetween with respect to the group of metal terminals and which join the group of metal terminals into a single unit by linking the terminals in the form of a row at both tips thereof near the bases of portions to be inserted into the through-holes in the boards;
    positioning protrusions that are fitted into fitting holes provided in the two boards are integrally provided in the paired resin linking members; and
    the positioning protrusions are provided only on one end of the row of the group of metal terminals that are arranged in the form of a row along the paired resin linking members.

* * * * *